United States Patent
Carcasi et al.

(10) Patent No.: US 7,671,412 B2
(45) Date of Patent: Mar. 2, 2010

(54) METHOD AND DEVICE FOR CONTROLLING TEMPERATURE OF A SUBSTRATE USING AN INTERNAL TEMPERATURE CONTROL DEVICE

(75) Inventors: Michael A. Carcasi, Austin, TX (US); Michael Philip Kincaid, Kyle, TX (US)

(73) Assignee: Tokyo Electron Limited, Tokyo (JP)

( * ) Notice: Subject to any disclaimer, the term of this patent is extended or adjusted under 35 U.S.C. 154(b) by 295 days.

(21) Appl. No.: 11/675,210

(22) Filed: Feb. 15, 2007

(65) Prior Publication Data

US 2008/0197121 A1 Aug. 21, 2008

(51) Int. Cl.
*H01L 27/01* (2006.01)

(52) U.S. Cl. .............................. 257/347; 257/E21.545; 438/799; 438/502; 438/517; 118/724; 118/725; 219/444.1

(58) Field of Classification Search ................. 257/347, 257/E21.545
See application file for complete search history.

(56) References Cited

U.S. PATENT DOCUMENTS

| | | | | |
|---|---|---|---|---|
| 4,883,770 A | * | 11/1989 | Dohler et al. | ................ 438/507 |
| 6,914,222 B2 | * | 7/2005 | Nakamura | ................ 219/444.1 |
| 2001/0042744 A1 | * | 11/2001 | Tachikawa et al. | ........ 219/444.1 |
| 2005/0217799 A1 | * | 10/2005 | O'Meara et al. | ......... 156/345.52 |

* cited by examiner

*Primary Examiner*—Tu-Tu V Ho
(74) *Attorney, Agent, or Firm*—Oblon, Spivak, McClelland, Maier & Neustadt, L.L.P.

(57) ABSTRACT

A substrate, thermal treatment assembly and method of operating the thermal treatment assembly are described for controlling the temperature of a substrate. An electrical potential is applied across two or more locations on the substrate in order to generate an electrical current through a portion of the substrate, thereby altering a temperature of the substrate. The electrical current may dissipate electrical energy in the form of thermal energy due to the intrinsic resistance of the portion of substrate to the flow of electrical current.

43 Claims, 9 Drawing Sheets

METHOD AND DEVICE FOR CONTROLLING TEMPERATURE OF A SUBSTRATE USING AN INTERNAL TEMPERATURE CONTROL DEVICE

BACKGROUND OF THE INVENTION

1. Field of Invention

The present invention relates to a method and device for treating a substrate, and more particularly to a substrate, thermal treatment assembly and method of operating the thermal treatment assembly for performing a thermal treatment process on the substrate.

2. Description of Related Art

In material processing methodologies, pattern etching comprises applying a thin layer of radiation-sensitive material, such as photoresist, to an upper surface of a substrate, patterning this thin layer of radiation-sensitive material using photolithography to form a pattern therein, and transferring the pattern to the underlying material film using an etching process. Photolithographic systems for performing the above-described material processing methodologies have become a mainstay of semiconductor device patterning for the last three decades, and are expected to continue in that role down to 65 nm resolution, and less.

The patterning of the radiation-sensitive material generally involves coating an upper surface of the substrate with a thin film of radiation-sensitive material, and then exposing the radiation-sensitive material to a geometric pattern of electromagnetic (EM) radiation using, for example, a photolithography system, followed by the removal of the irradiated regions of the radiation-sensitive material (as in the case of positive photo-resist), or non-irradiated regions (as in the case of negative resist) using a developing solvent.

Moreover, throughout the coating, exposing and developing processes, the radiation-sensitive material is thermally treated several times during the preparation of the pattern in the thin layer of radiation-sensitive material. For example, the radiation-sensitive material is baked following the application of the material to the substrate (i.e., post-application bake, PAB), and also the radiation-sensitive material is baked following the exposure of the material to EM radiation (i.e., post-exposure bake, PEB). Further yet, the radiation-sensitive material undergoes a hard bake following the developing of the pattern to remove residual developing solvent.

One of the more critical thermal treatments during the preparation of the photoresist mask is the PEB. One reason for this criticality includes the observation that this treatment affects the uniformity of the critical dimension (CD) of the pattern formed in the photoresist mask across the substrate. With the current use of chemically amplified resists (CAR), these resists undergo a catalytic reaction upon exposure to the thermal treatment which causes acid diffusion that, in turn, affects the CD during the subsequent developing process. As a result, variations in the CD across the substrate are strongly affected by spatial variations in substrate temperature.

Often times, this sensitivity of the CD to spatial temperature variations is referred to as PEB sensitivity in the lithography community. For example, current ArF resists have a PEB sensitivity of approximately 1 to 5 nanometers (nm) per degree C. temperature variation. As a result, the relationship between variations in the substrate temperature and the acid diffusion rate/distance and, hence, variations in the CD require strict control of the uniformity of the substrate temperature, particularly during the PEB.

SUMMARY OF THE INVENTION

Accordingly, one object of the present invention is to improve control of uniformity of substrate temperature.

One embodiment provides a substrate, a thermal treatment assembly and method of operating the thermal treatment assembly for performing a thermal treatment process on the substrate.

Another embodiment provides a substrate, a thermal treatment assembly and method of operating the thermal treatment assembly for performing a thermal treatment process on the substrate, wherein the thermal treatment process produces a substantially uniform spatial temperature distribution on the substrate.

These and/or other embodiments may be provided by a platform for preparing electronic devices. The platform includes a substrate having an upper surface configured to facilitate the formation of one or more electronic structures and a lower surface configured to contact a substrate holder during the processing of the upper surface. A temperature control structure is formed within the substrate proximate the lower surface, which alters a temperature of the temperature control structure.

Another embodiment includes a thermal treatment assembly for treating a substrate and a method of operating the thermal treatment assembly. The thermal treatment assembly includes a substrate having an upper surface configured to facilitate the formation of one or more electronic structures and a lower surface opposite the upper surface, the substrate further including a temperature control structure formed within the substrate proximate the lower surface. The assembly also includes a substrate holder configured to support the substrate on a receiving surface, wherein the substrate holder includes a first electrical contactor within the receiving surface configured to electrically contact a first location of the temperature control structure when the substrate rests on the substrate holder and a second electrical contactor within the receiving surface configured to electrically contact a second location of the temperature control structure when the substrate rests on the substrate holder An electrical power supply is configured to couple an electrical potential difference between the first electrical contactor and the second electrical contactor, wherein the application of the electrical potential difference causes the conduction of an electrical current through the temperature control structure between the first location and the second location, which alters a temperature of the temperature control structure.

Another embodiment includes a substrate. The substrate includes a semiconductor substrate and a temperature control element embedded within the bottom surface layer of the semiconductor substrate, wherein two locations of the embedded temperature control element are configured to electrically contact two electrical contactors positioned on the upper surface of a substrate holder configured to support the semiconductor substrate. The two electrical contactors are configured to receive an electrical potential difference imposed therebetween.

Yet another embodiment includes a substrate. The substrate includes a silicon-on-insulator (SOI) substrate and a temperature control element embedded within the base layer of the SOI substrate beneath the insulator later, wherein two locations of the embedded temperature control element are configured to electrically contact two electrical contactors positioned on the upper surface of a substrate holder configured to support the SOI substrate. The two electrical contactors are configured to receive an electrical potential difference imposed there between.

DETAILED DESCRIPTION OF PREFERRED EMBODIMENTS

In the following description, in order to facilitate a thorough understanding of the invention and for purposes of explanation and not limitation, specific details are set forth, such as a particular geometry of the material processing system and descriptions of various components and processes used therein. However, it should be understood that the invention may be practiced in other embodiments that depart from these specific details.

As noted in the Background section above, the relationship between variations in substrate temperature and variations in CD requires strict control of substrate temperature uniformity, particularly during the PEB. The present inventors recognized that conventional methods of substrate temperature control use temperature control elements, such as a heater, within the substrate holder. The inventors also recognized that spatial variation in the substrate holder design and thermal conductance between the substrate and substrate holder surface can contribute to temperature non-uniformity of the substrate itself. Applicant's invention addresses these problems by providing a temperature control element within the substrate itself.

Figure 1:
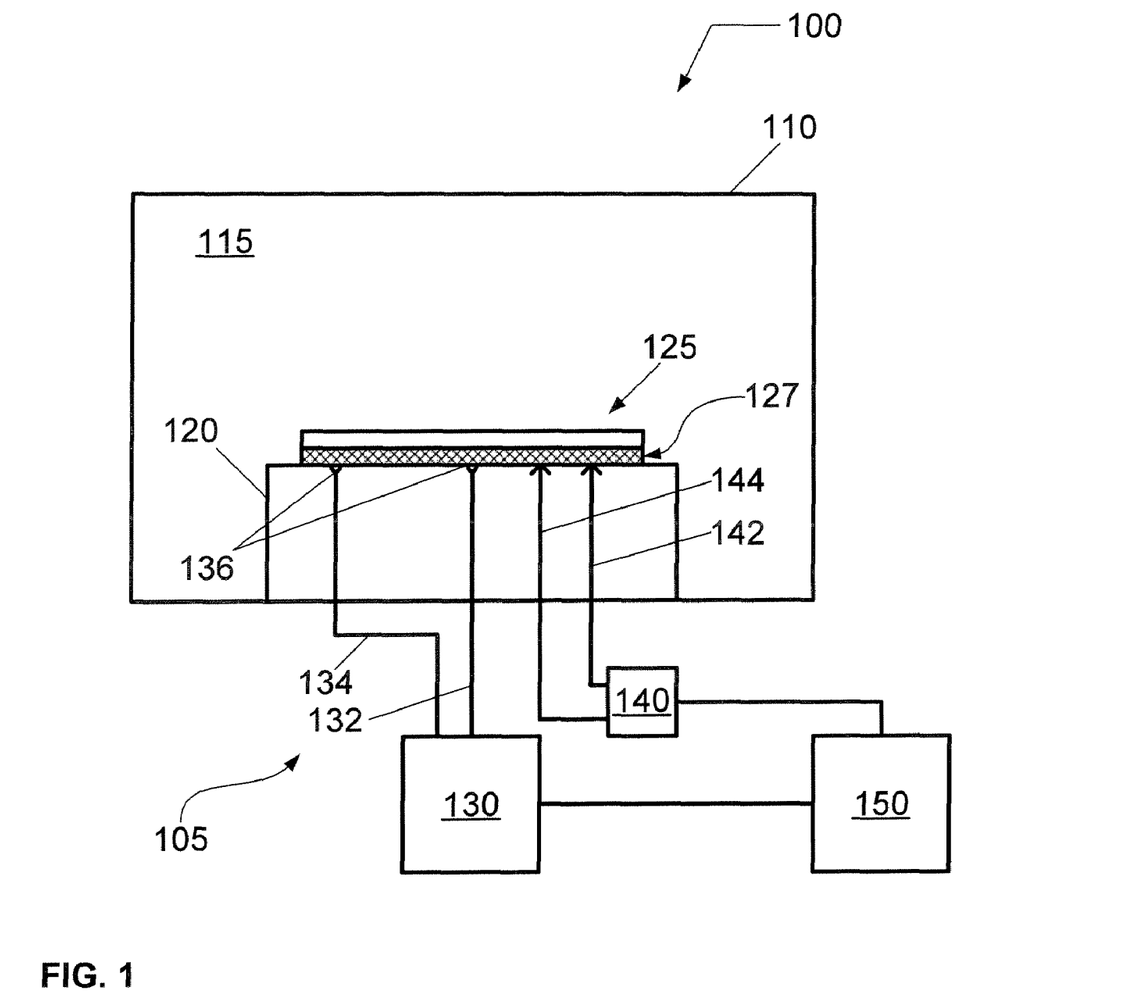
FIG. 1 depicts a material processing system for processing a substrate according to an embodiment.

Referring now to the drawings, wherein like reference numerals designate identical or corresponding parts throughout the several views, FIG. 1 illustrates a material processing system 100 configured to treat a substrate 125 therein. The material processing system 100 comprises a process chamber 110 and a thermal treatment assembly 105 coupled to the process chamber 110 and configured to elevate the temperature of substrate 125.

The thermal treatment assembly 105 comprises a substrate holder 120 coupled to the process chamber 110 and configured to support the substrate 125 within a process space 115. Additionally, the thermal treatment assembly 105 comprises a power supply 130 coupled to the substrate holder 120 and configured to couple electrical power to a temperature control structure 127 proximate a lower surface of substrate 125. The coupling of electrical power to the temperature control structure 127 facilitates the flow of electrical current through the structure 127, which, in turn, causes heating of substrate 125 via Joule (ohmic) heating, or cooling of the substrate due to reduction of current or thermo-electric cooling.

Joule heating refers to the increase in temperature of a conductor as a result of the resistance to a flow of electrical current. The resistance of the conductor is related to the resistivity of the conductor and various geometric parameters, such as the length of the conductor and a cross-sectional dimension of the conductor. At the atomic level, Joule heating is the result of moving electrons colliding with atoms of the conductor, where upon momentum is transferred to the atom thereby increasing its kinetic energy and thus producing heat. Joule's Law is expressed as $Q=I^2Rt$, where Q represents the heat generated by a constant current I flowing through a conductor of resistance R for a time period t.

Thermo-electric cooling refers to a reduction in temperature due to current flow across a junction of dissimilar materials. As would be understood by one of ordinary skill in the art, thermo-electric cooling may be used in conjunction with Joule heating to provide temperature control of the substrate 125.

As illustrated in FIG. 1, electrical power from electrical power supply 130 may be coupled to the temperature control structure 127 via two terminal leads, 132 and 134, having electrical contactors 136 configured to make electrical contact with the temperature control structure at two locations, where substrate 125 rests on substrate holder 120. Electrical power supply 130 may be configured to provide direct current (DC) electrical power, or it may be configured to provide alternating current (AC) electrical power.

Referring still to FIG. 1, substrate 125 comprises an upper surface configured to facilitate the formation of one or more electronic structures and a lower surface that is opposite the upper surface and is configured to contact substrate holder 125 during the processing of the upper surface. For example, substrate 125 may include a semiconductor substrate, such as a silicon or silicon-germanium substrate, a conductive substrate, or a non-conductive substrate. Additionally, for example, substrate 125 may include a silicon-on-insulator (SOI) substrate. The SOI substrate comprises a base layer, a device layer having the upper surface that facilitates the formation of the one or more electronic structures, and an insulation layer disposed between the base layer and the device layer.

The substrate may include an arbitrary shape. For example, the substrate may comprise a circular wafer of various diameters including, but not limited, to a 200 mm wafer, a 300 mm wafer, a 450 mm wafer, or larger. Alternatively, for example, the substrate may comprise a rectangular substrate, such as a flat panel or LCD (liquid crystal display).

According to one embodiment, the temperature control structure 127 comprises a material sub-layer formed on the lower surface or embedded within the substrate 125 proximate the lower surface. If, for instance, substrate 125 is a conductive substrate, then an insulative layer may be disposed between the substrate 125 and the material sub-layer. If, for instance, substrate 125 is a SOI substrate, then the material sub-layer may be formed on the lower surface or embedded within the base layer proximate the lower surface. Thus, the material sub-layer can provide part of a platform for preparing electronic structures, and the platform has no effect on operation of the electronic structures. The material sub-layer can include a material composition having an electrical conductivity greater than the electrical conductivity of substrate 125. Further, the material sub-layer can include layers of different material to provide thermo-electric heating and cooling. The material sub-layer may be formed by depositing a thin film of conductive material on the lower surface using, for example, a vapor deposition process or a spray coating process. For instance, substrate 125 can comprise a silicon substrate, and the material sub-layer can include a metal-containing film, such as a metal (e.g., W), metal alloy or metal silicide. Additionally, the material sub-layer may be formed by doping the lower surface using ion implant. For example, substrate 125 can comprise a silicon substrate, and the material sub-layer can include doped silicon, such as phosphorus (P) doped silicon or boron (B) doped silicon.

Figure 2A:
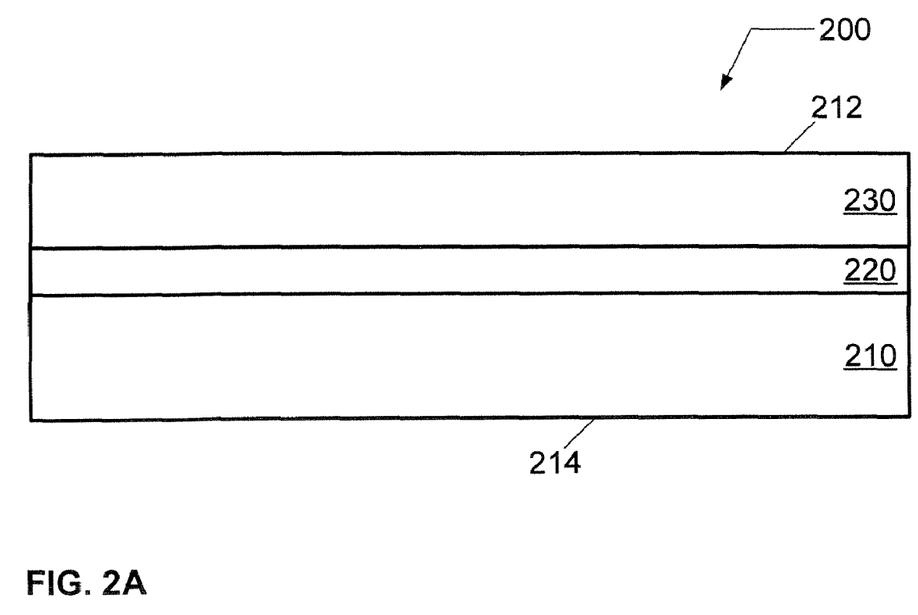
FIGS. 2A through 2C illustrate a method of preparing a substrate according to an embodiment.
Figure 2B:
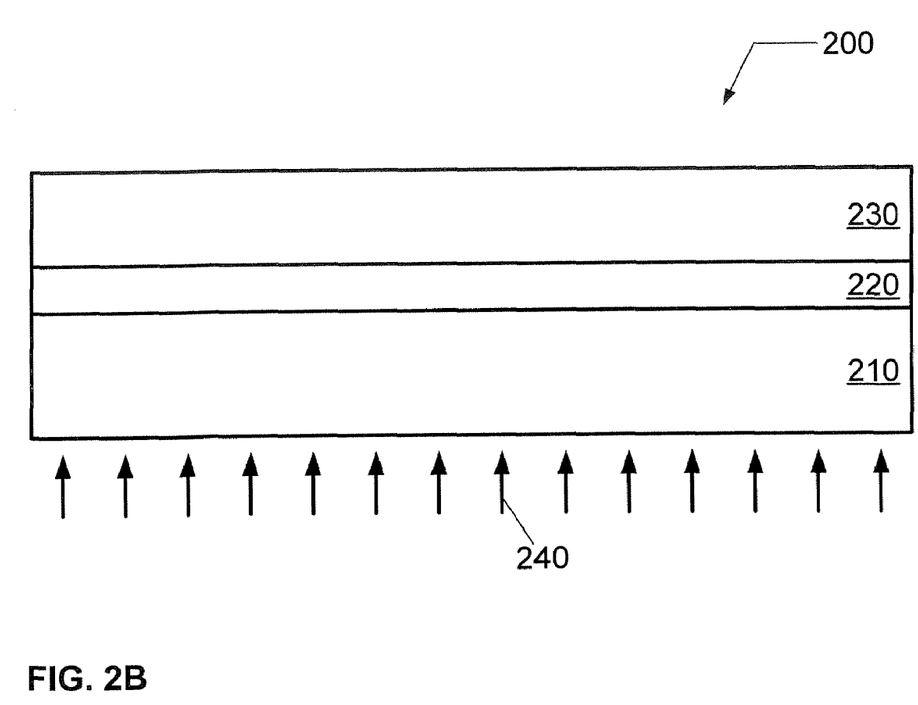
Figure 2C:
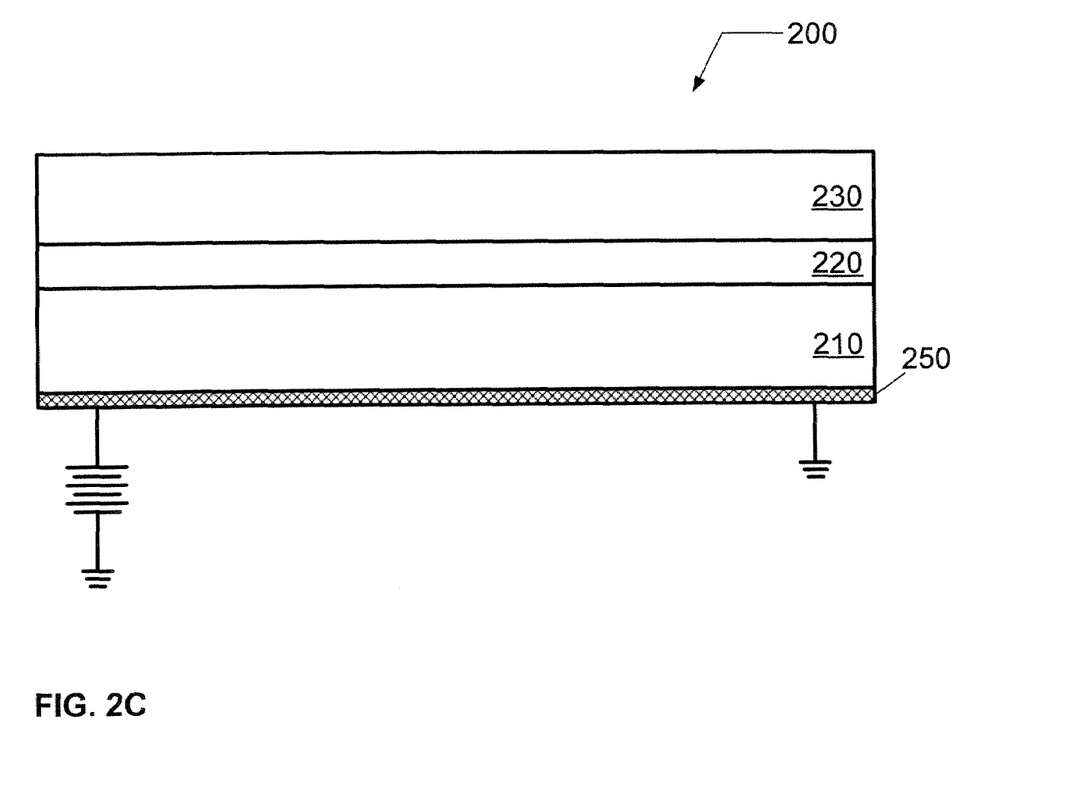

Referring now to FIGS. 2A through 2C, a method of constructing a platform for preparing electronic structures is illustrated. FIG. 2A depicts a platform 200 comprising a substrate having a base layer 210 with a lower surface 214 for contacting a substrate holder, a device layer 230 with an upper surface 212 that facilitates the formation of one or more electronic structures, and an insulation layer 220 disposed between the base layer 210 and the device layer 230. For example, the substrate may be a SOI substrate. As shown in FIG. 2B, the lower surface 214 is exposed to a flux of energetic ions 240 which are implanted into the surface layer of the lower surface 214 to form a resistive treating structure. Thereafter, as shown in FIG. 2C, the doped material sub-layer 250 produced using ion implantation is coupled to a first electric potential at a first location and a second electric potential at a second location, whereby a difference between the first electric potential and the second electric potential causes an electrical current to flow between the first location of electrical contact and the second location of electrical contact to provide Joule heating, as discussed above. As would be understood by one of ordinary skill in the art, a similar technique can be used to provide a temperature control structure for providing thermo-electric heating and cooling.

According to another embodiment, the temperature control structure 127 comprises one or more resistive heating elements formed on the lower surface or embedded within substrate 125 proximate the lower surface. If, for instance, substrate 125 is a conductive substrate, then an insulative layer may be disposed between the substrate 125 and the one or more resistive heating elements. If, for instance, substrate 125 is a SOI substrate, then the one or more resistive heating elements may be formed on the lower surface or embedded within the base layer proximate the lower surface. Each of the one or more resistive heating elements may be formed by a combination of etching and deposition processes whereby a heating element of arbitrary shape can be formed on or below the lower surface. For example, the resistive heating element can include a wire or metal line characterized by a length and lateral dimension, wherein the pattern of the wire or metal line formed in substrate 125 can be circular or rectangular (e.g., circular or rectangular rings), or a serpentine, or a spiral, or any combination thereof. One or more thermo-electric heating/cooling structures may also be provided.

Each resistive heating element comprises a first electrical contact at a first location configured to be coupled to a first electric potential and a second electrical contact at a second location configured to be coupled to a second electrical potential, wherein a difference between the first electrical potential and the second electrical potential causes an electrical current to flow between the first electrical contact and the second electrical contact. Furthermore, once the one or more resistive heating elements are formed in substrate 125, an isolation layer can be applied to the lower surface of the substrate except where the first electrical contact is configured to be coupled to the first electric potential and the second electrical contact is configured to be coupled to the second electric potential.

Figure 3A:
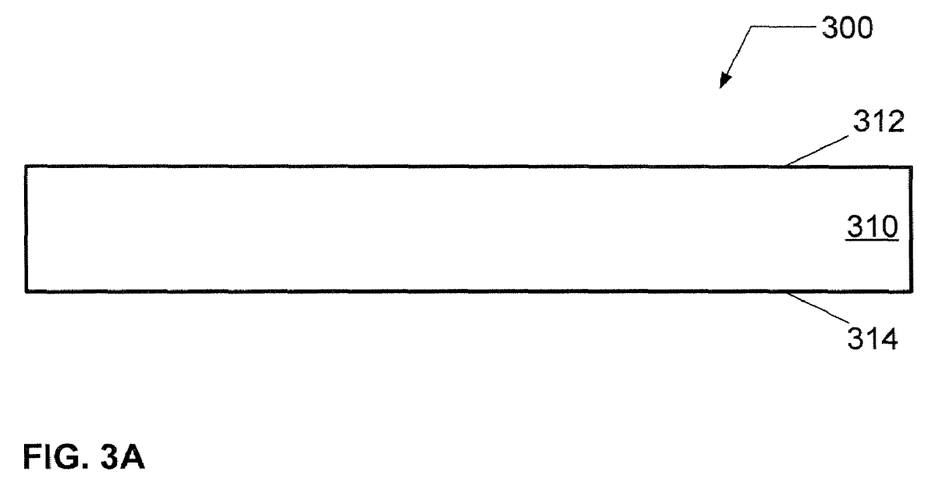
FIGS. 3A through 3F illustrate a method of preparing a substrate according to another embodiment.
Figure 3B:
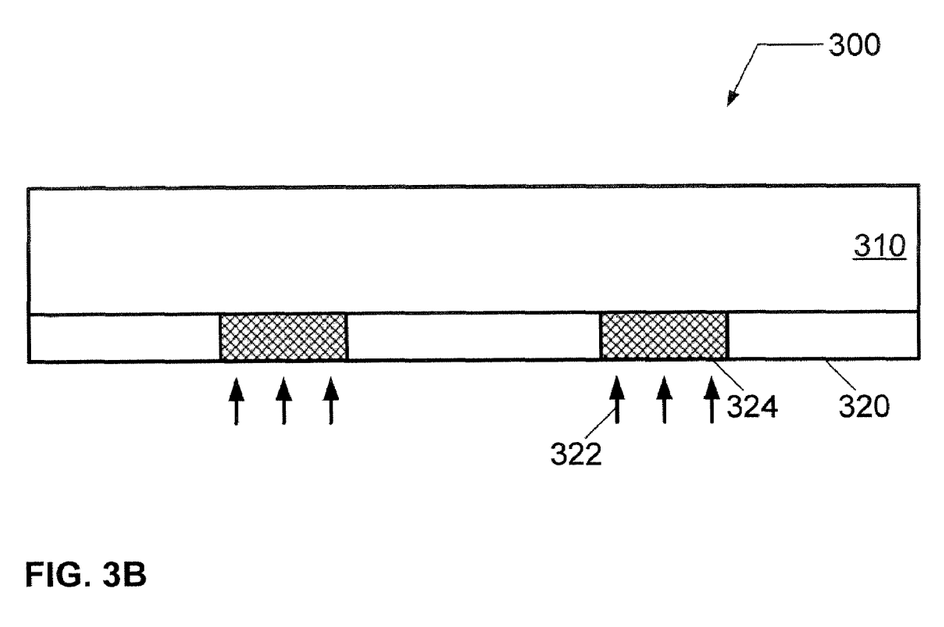
Figure 3C:
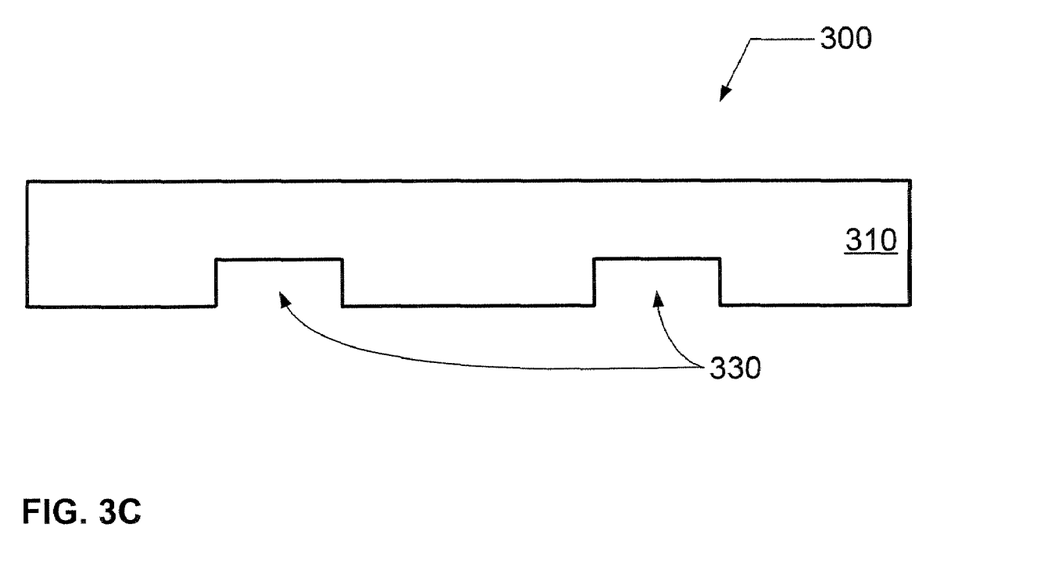

Referring now to FIGS. 3A through 3F, a method of constructing a platform for preparing electronic structures is illustrated. FIG. 3A depicts a platform 300 comprising a substrate 310 having a lower surface 314 for contacting a substrate holder, and an upper surface 312 that facilitates the formation of one or more electronic structures. As shown in FIGS. 3B and 3C, a mask layer 320 is applied to the lower surface 314 and regions 324 of mask layer 320 are exposed to a pattern of EM radiation 322. Once the exposed regions 324 are removed using a developing process, the patterned mask layer 320 may be utilized in an etching process, such as a dry plasma etching process, to form feature pattern 330 within the lower surface 314, within which the one or more resistive heating elements may be formed.

The mask layer 320 can be a photo-resist coating that may be formed and developed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology. The exposure to EM radiation can be performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Furthermore, the etching process can include a wet etching process or a dry etching process, such as a dry non-plasma etching process or dry plasma etching process.

Figure 3D:
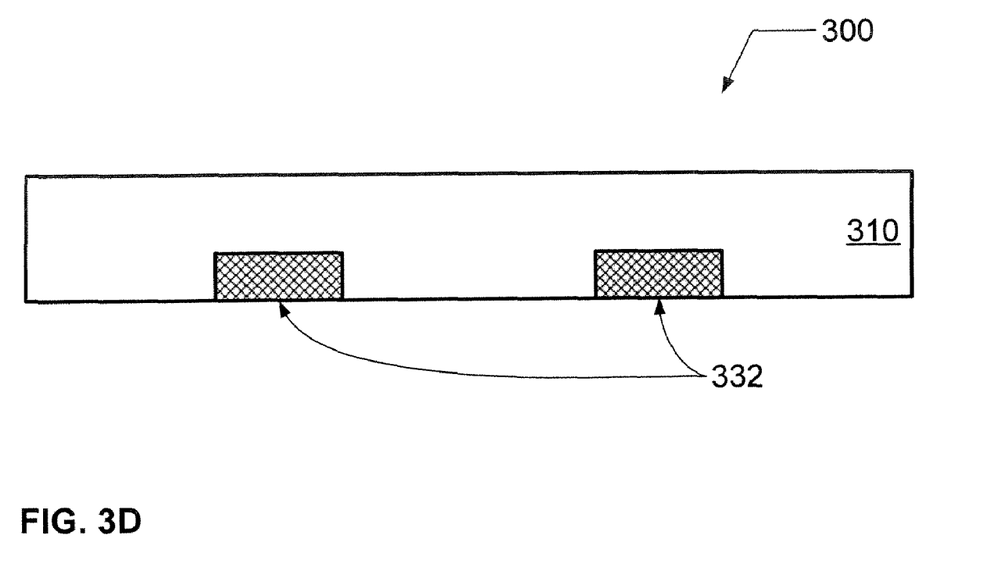

Once feature pattern 330 is formed, it may be filled using a deposition process. The material sub-layer 332 may be formed by depositing material within the feature using, for example, a vapor deposition process, plating process or a spray coating process. For instance, the material can include a metal-containing material, such as a metal (e.g., W), metal alloy or metal silicide. Optionally, following the deposition process, a planarization process can be performed.

Figure 3E:
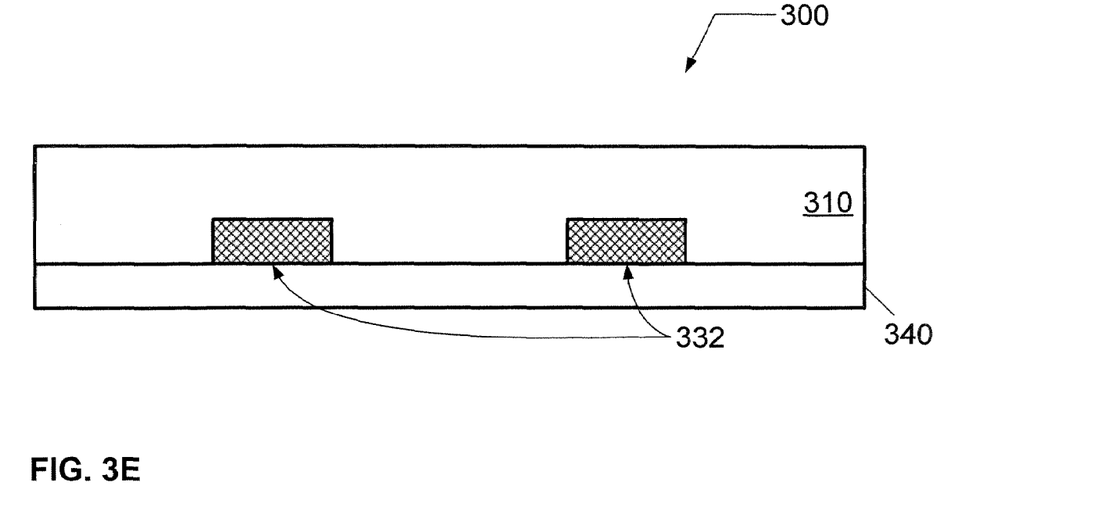
Figure 3F:
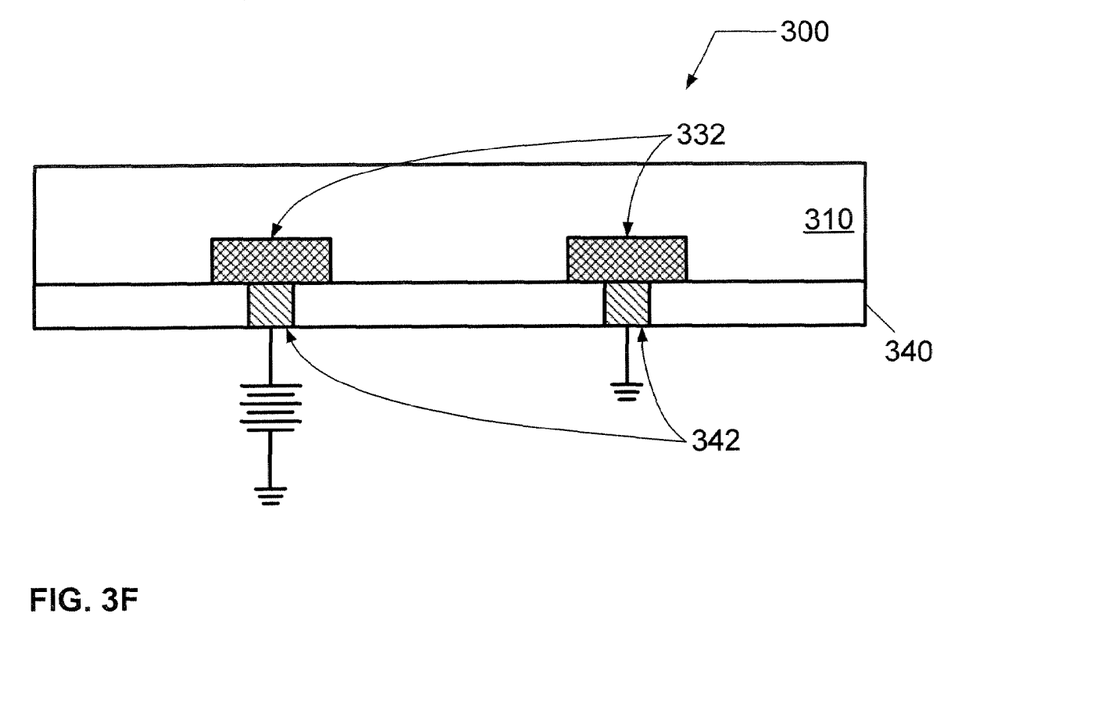

As shown in FIG. 3E, a protective layer 340 is formed on the lower surface 314. The protective layer can be formed using spin-on deposition (SOD) techniques, or vapor deposition techniques, or spray coating techniques. Optionally, the protective layer may be planarized using planarization techniques such as chemical-mechanical polishing (CMP). Thereafter, as shown in FIG. 3F, contacts 342 are formed in the protective layer 340 in order to make electrical contact to the patterned resistive heating element 332 at a first location and to make electrical contact to the patterned resistive heating element 340 at a second location. Using techniques described above, the protective layer 340 may be patterned and filled to form contacts 342. One electrical contact is coupled to a first electric potential at the first location and the other electrical contact is coupled to a second electric potential at the second location, whereby a difference between the first electric potential and the second electric potential causes an electrical current to flow between the first location of electrical contact and the second location of electrical contact.

According to another embodiment, the temperature control structure 127 such as a resistive heating structure may be configured in one or more zones or thermal regions on substrate 125. A multi-zone resistive heating structure may comprise separately distinct heating zones in the radial direction, or azimuthal direction, or a combination thereof. For example, a first thermal region can include a substantially central region of substrate 125, while a second thermal region can include a substantially peripheral region of substrate 125. Alternatively, a multi-zone resistive heating structure may comprise separately distinct heating zones following a Cartesian, or grid-like, arrangement. For example, each thermal region can correspond to a die on the substrate 125. Each thermal region, or zone, can comprise a set of electrical contacts, wherein each set of electrical contacts may be independently subjected to the same or a different electric potential difference. For instance, the current which flows through each zone can be adjusted and, hence, the heating of each zone may be adjusted. Multi-zone thermo-electric heating/cooling devices may also be provided.

Figure 4A:
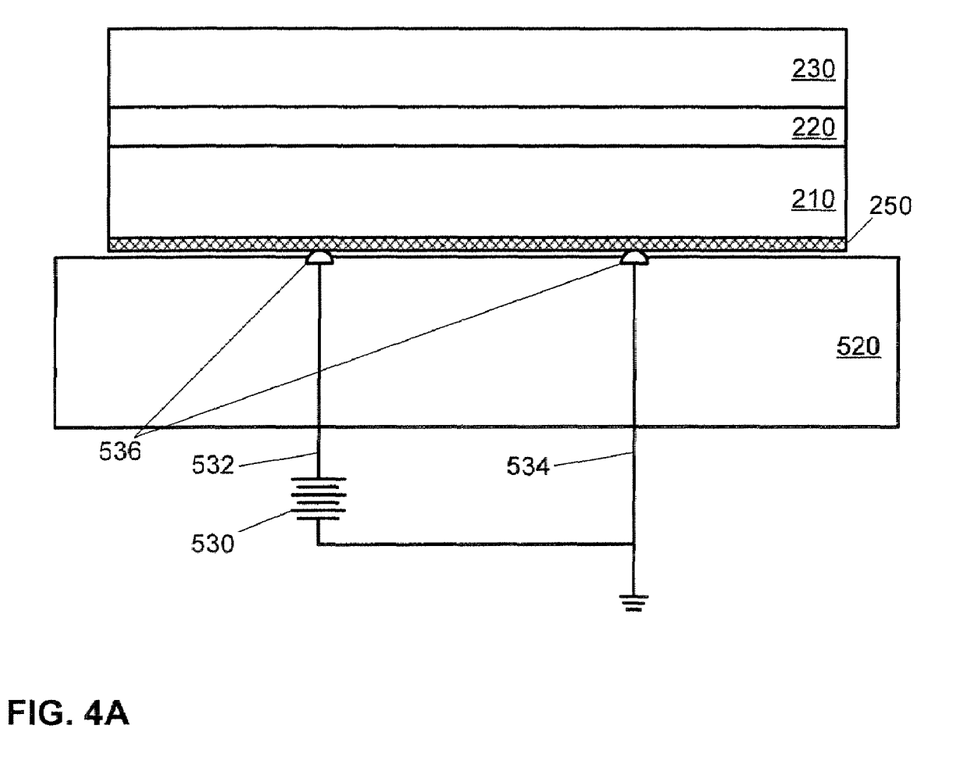
FIGS. 4A and 4B illustrate a substrate holder for supporting the substrate depicted in FIGS. 2C and 3F according to another embodiment.

Referring now to FIG. 4A, a thermal treatment assembly is illustrated according to an embodiment. The thermal treatment assembly comprises a substrate holder 520 configured to support a substrate having a base layer 210, a device layer 230, and an insulation layer 220 disposed between the base layer 210 and the device layer 230. Additionally, the substrate comprises a temperature control structure such as a resistive heating structure, having an electrically conductive layer 250, which can support the flow of an electrical current to generate heat in the substrate via Joule heating The layer 250 may be replaced with a thermo-electric structure, as described above. The conductive layer 250 may be formed by depositing a conductive material on the lower surface of the base layer 210, or it may be formed by doping the lower surface of the base layer 210. Although the substrate shows a fixed number of layers, the substrate may have more layers or less layers, and may or may not have structures formed thereon.

The thermal treatment assembly further comprises a power source 530 coupled to the substrate holder 520 and configured to couple an electric potential difference across contacts 536 via electrical interconnects 532 and 534. The electrical interconnects 532 and 534 are electrically insulated from the substrate holder 520.

External surfaces of the substrate holder 520 may have a coating. For example, the coating may include a conductive, non-conductive, or semi-conductive material. Additionally, for example, the coating may include a ceramic, a plastic, or a polymeric coating. Additionally yet, for example, the coating can include Teflon®, Kapton®, or Vespel®. Furthermore, for example, the coating can include surface anodization. Further yet, for example, the coating can include $Al_2O_3$, $Sc_2O_3$, $Sc_2F_3$, $YF_3$, $La_2O_3$, $Y_2O_3$, or $DyO_3$, or a combination thereof.

The thermal assembly may or may not comprise a substrate clamping system (i.e., electrical or mechanical clamping system), an additional heating system, a cooling system, a substrate backside gas supply system for improved thermal conductance between the substrate and the substrate holder 520, etc. For example, a clamping system can increase the contact force between the substrate and the substrate holder 520. The design and implementation of a clamping system is well known to those skilled in the art of semiconductor manufacturing equipment and the use of mechanical and electrostatic clamping systems.

As described above, the substrate holder can include temperature control elements that may be utilized to complement the heating and/or cooling of the substrate by those temperature control structures integrated within the substrate. For example, when heating the substrate, the substrate holder may further include a heating system, such as one or more resistive heating elements. The substrate holder heating system can be utilized to enhance the heating of the substrate by the heating structures integrated within the substrate. The heating structures integrated within the substrate can be used to spatially adjust or fine-tune the temperature profile of the substrate. Alternatively, for example, when cooling the substrate, the substrate holder may further include a cooling system, such as one or more fluid cooling channels. The substrate holder cooling system can be utilized to enhance the cooling of the substrate by the cooling structures integrated within the substrate. The cooling structures integrated within the substrate can be used to spatially adjust or fine-tune the temperature profile of the substrate.

Figure 4B:
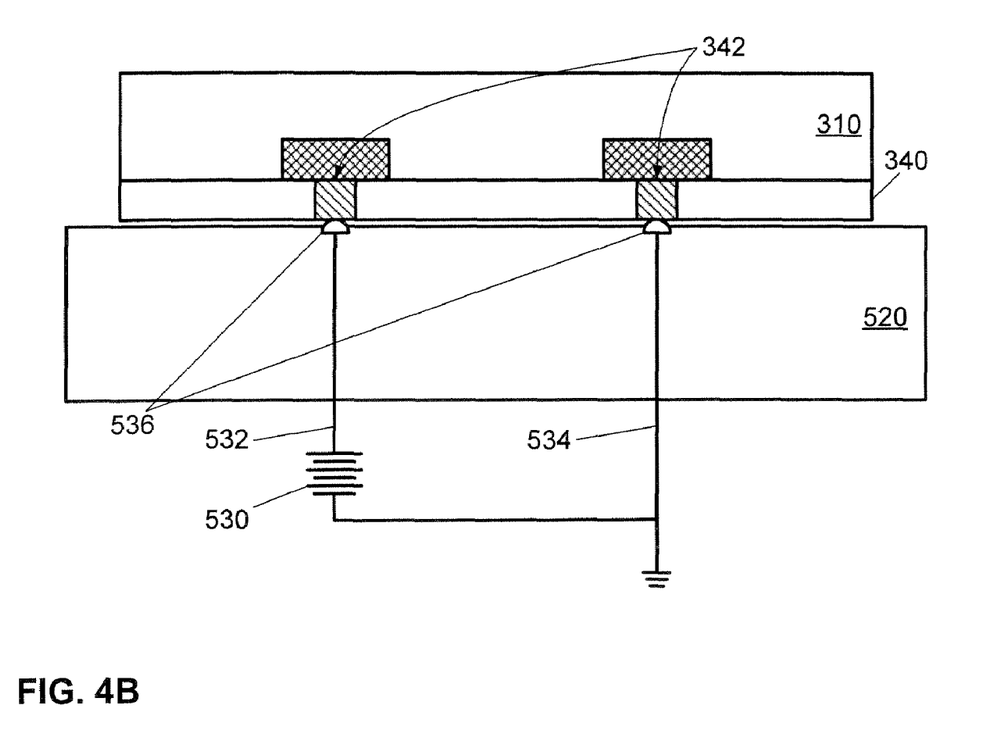

Referring now to FIG. 4B, a thermal treatment assembly is illustrated according to another embodiment. The thermal treatment assembly comprises many of the same elements depicted in FIG. 4A, wherein like reference numerals designate equivalent parts. A substrate is shown comprising a base layer 310 within which a temperature control structure such as a resistive heating structure has been formed and a protective layer 340 through which electrical contact is made to the resistive heating structure via contacts 342. Although the substrate shows one layer (excluding the protective layer), the substrate may have more layers or less layers, and may or may not have structures formed thereon.

Referring again to FIG. 1, the thermal treatment assembly 105 may further comprise a temperature monitoring system 140 and one or more temperature measuring devices 142 and 144. A controller 150 can be coupled to the temperature monitoring system 140 and can be configured to perform at least one of adjusting, controlling, or monitoring the temperature of substrate 125, or substrate holder 120, or both, at one or more locations.

The temperature measuring device can include an optical fiber thermometer, an optical pyrometer, a band-edge temperature measurement system as described in pending U.S. patent application Ser. No. 10/168544, filed on Jul. 2, 2002, the contents of which are incorporated herein by reference in their entirety, or a thermocouple such as a K-type thermocouple. Examples of optical thermometers include: an optical fiber thermometer commercially available from Advanced Energies, Inc., Model No. OR2000F; an optical fiber thermometer commercially available from Luxtron Corporation, Model No. M600; or an optical fiber thermometer commercially available from Takaoka Electric Mfg., Model No. FT-1420.

The temperature monitoring system 140 can provide sensor information to controller 150 in order to adjust at least one of electrical power, an electrical voltage, or an electrical current coupled to the temperature control structure 127, a cooling element, a backside gas supply system, or an HV (high voltage) DC voltage supply for an ESC (electrostatic chuck) either before, during, or after processing.

Controller 150 includes a microprocessor, memory, and a digital I/O port (potentially including D/A and/or A/D converters) capable of generating control voltages sufficient to communicate and activate inputs to the thermal treatment assembly 105 as well as monitor outputs from the thermal treatment assembly 105. As shown in FIG. 1, controller 150 can be coupled to and exchange information with substrate holder 120, power source 130, and temperature monitoring system 140. A program stored in the memory is utilized to interact with the aforementioned components of the thermal treatment assembly according to a stored process recipe. One example of controller 150 is a DELL PRECISION WORKSTATION 640™, available from Dell Corporation, Austin, Tex.

The controller 150 may also be implemented as a general purpose computer, processor, digital signal processor, etc., which causes a thermal treatment assembly to perform a portion or all of the processing steps of the invention in response to the controller 150 executing one or more sequences of one or more instructions contained in a computer readable medium. The computer readable medium or memory is configured to hold instructions programmed according to the teachings of the invention and can contain data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

Controller 150 may be locally located relative to the thermal treatment assembly 105, or it may be remotely located relative to the thermal treatment assembly 105 via an internet or intranet. Thus, controller 150 can exchange data with the thermal treatment assembly 105 using at least one of a direct connection, an intranet, or the internet. Controller 150 may be coupled to an intranet at a customer site (i.e., a device maker, etc.), or coupled to an intranet at a vendor site (i.e., an equipment manufacturer). Furthermore, another computer (i.e., controller, server, etc.) can access controller 150 to exchange data via at least one of a direct connection, an intranet, or the internet.

According to yet another embodiment, the material processing system 100 that utilizes thermal treatment assembly 105 can include a thermal treatment module having the above described thermal treatment assembly in a photoresist coating system, such as a track system. For example, the track system may include a Clean Track ACT 8 SOD (spin-on dielectric), ACT 12 SOD, and Lithius coating systems commercially available from Tokyo Electron Limited (TEL). Additionally, for example, the thermal treatment assembly may be utilized for thermally treating a substrate during a post-application bake (PAB), a post-exposure bake (PEB) or a hard bake. Alternatively, the material processing system 100 may include a thermal treatment module in a dielectric coating system, such as a spin-on-glass (SOG) or spin-on-dielectric (SOD) system. The SOD system may, for example, be configured prepare low dielectric constant (low-k) or ultra-low-k dielectric films.

Alternatively, the thermal treatment assembly may be utilized in a material processing system that utilizes plasma. Alternatively, the thermal treatment assembly may be utilized in a material processing system that does not utilize plasma. Alternatively yet, the thermal treatment assembly may be utilized in a thermal treatment system configured to provide thermal treatment of a substrate prior to the formation of a film, structure, or feature on the substrate, during the formation of the film, structure, or feature on the substrate, or following the formation of the film, structure, or feature on the substrate.

Alternately yet, the thermal treatment assembly may be utilized in a material processing system that includes: a photoresist patterning chamber such as, for example, an ultraviolet (UV) lithography system; a vapor deposition chamber such as a chemical vapor deposition (CVD) system, a plasma enhanced CVD (PECVD) system, an atomic layer deposition (ALD) system, a plasma enhanced ALD (PEALD) system, a physical vapor deposition (PVD) system or an ionized PVD (iPVD) system; a rapid thermal processing (RTP) chamber such as a RTP system for thermal annealing; or a batch-processing vertical furnace.

Figure 5:
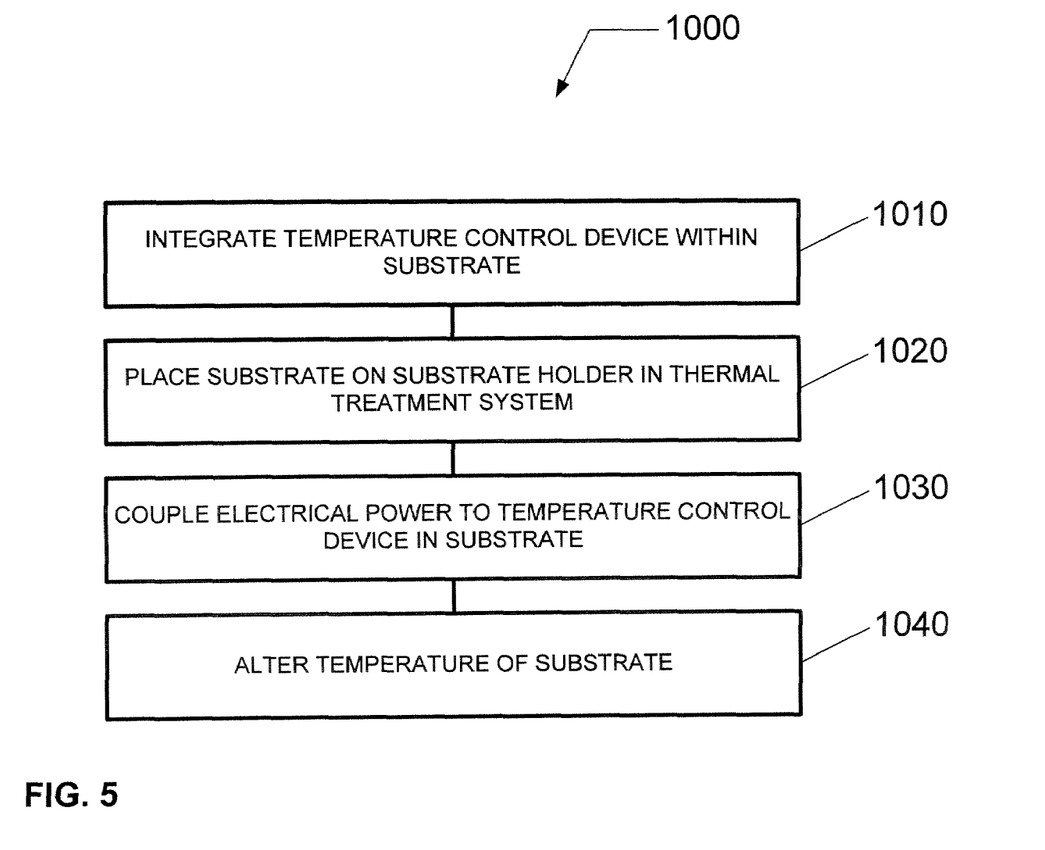
FIG. 5 presents a method of heating a substrate according to yet another embodiment.

Referring now to FIG. 5, a flow chart of a method of utilizing a thermal treatment assembly to perform a thermal treatment process on a substrate according to an embodiment. Procedure 1000 begins in 1010 with integrating a temperature control structure within a substrate. The temperature control structure may include a resistive heating structure and/or a thermo-electric device and can be implemented as any of the structures described above.

In 1020, the substrate is placed upon a substrate holder in a processing system. The substrate holder is configured to support the substrate and make electrical contact with the substrate at specific locations on the backside of the substrate. Providing contact between the substrate and substrate holder may require alignment devices or an alignment procedure or a combination thereof.

In 1030, an electric potential difference is coupled between a first electrical contact at a first location and a second electrical contact at a second location in order to generate a flow of electrical current through the temperature control structure.

In 1040, the substrate is heated and/or cooled based on the electrical current. For example, the substrate can be heated as a result of the dissipation of electrical energy due to the electrical resistance of a resistive heating structure.

Additionally, the temperature of the substrate or substrate holder or both may be monitored using a temperature monitoring system as described above. The sensor information for temperature can be utilized by a controller, as described above, to adjust and/or control the temperature of the substrate or substrate holder at one or more locations. For example, an increase in the electrical current (or potential difference across contacts) can lead to an increase in heating, while a decrease in the electrical current can lead to a decrease in heating. As another example, a change in direction of current can cause heating and cooling of a thermo-electric structure.

Although only certain exemplary embodiments of inventions have been described in detail above, those skilled in the art will readily appreciate that many modifications are possible in the exemplary embodiments without materially departing from the novel teachings and advantages of this invention.

The invention claimed is:

1. A platform for preparing electronic devices, comprising:
    a substrate having an upper surface configured to facilitate the formation of one or more electronic structures and a lower surface configured to contact a substrate holder during the processing of said upper surface; and
    a temperature control structure formed within said substrate proximate said lower surface, and configured to conduct an electrical current which alters a temperature of the temperature control structure, wherein
    the substrate is detachable from the substrate holder.

2. The platform of claim 1, wherein said temperature control structure comprises a resistive heating structure configured to heat the substrate by Joule ohmic heating.

3. The platform of claim 2, wherein said resistive heating structure comprises a material sub-layer formed at said lower surface and having an electrical conductivity greater than the electrical conductivity of said substrate.

4. The platform of claim 3, wherein said material sub-layer comprises a thin film of conductive material deposited on said lower surface.

5. The platform of claim 3, wherein said material sub-layer comprises a doped region ion implanted into said lower surface.

6. The platform of claim 3, wherein said substrate comprises a silicon substrate and said resistive heating structure comprises a doped silicon sub-layer formed adjacent said lower surface of said substrate.

7. The platform of claim 2, wherein said resistive heating structure comprises one or more resistive heating elements, each resistive heating element having a first electrical contact configured to be coupled to a first electric potential and a second electrical contact configured to be coupled to a second electrical potential, wherein a difference between said first electrical potential and said second electrical potential causes an electrical current to flow between said first electrical contact and said second electrical contact.

8. The platform of claim 7, wherein each of said one or more resistive heating elements is formed at said lower surface of said substrate and is insulated by an isolation layer applied to said lower surface of said substrate except where said first electrical contact is configured to be coupled to said first electric potential and said second electrical contact is configured to be coupled to said second electric potential.

9. The platform of claim 8, wherein said isolation layer comprises a material film selectively deposited on said lower surface of said substrate.

10. The platform of claim 8, wherein said isolation layer comprises a material film epitaxially grown on said lower surface of said substrate.

11. The platform of claim 2, wherein said substrate comprises:
a base layer having said lower surface proximate to which said resistive heating structure is formed;
a device layer having said upper surface that facilitates the formation of said one or more electronic structures; and
an insulation layer disposed between said base layer and said device layer.

12. The platform of claim 11, wherein said resistive heating structure comprises a material sub-layer comprising a thin film of conductive material deposited on said lower surface.

13. The platform of claim 11, wherein said resistive heating structure comprises a doped material sub-layer ion implanted into said lower surface of said substrate.

14. The platform of claim 11, wherein said base layer and said device layer comprise silicon, said insulation layer comprises silicon dioxide, and said resistive heating structure comprises a doped silicon sub-layer.

15. The platform of claim 11, wherein said resistive heating structure comprises one or more resistive heating elements, each resistive heating element having a first electrical contact configured to be coupled to a first electric potential and a second electrical contact configured to be coupled to a second electrical potential, wherein a difference between said first electrical potential and said second electrical potential causes an electrical current to flow between said first electrical contact and said second electrical contact.

16. The platform of claim 15, wherein each of said one or more resistive heating elements is formed at said lower surface of said substrate and wherein each of said one or more resistive heating elements is insulated by an isolation layer applied to said lower surface of said substrate except where said first electrical contact is configured to be coupled to said first electric potential and said second electrical contact is configured to be coupled to said second electric potential.

17. The platform of claim 16, wherein said isolation layer comprises a material film selectively deposited on said lower surface of said substrate.

18. The platform of claim 16, wherein said isolation layer comprises a material film expitaxially grown on said lower surface of said substrate.

19. The platform of claim 1, wherein said platform comprises a plurality of resistive heating structures.

20. A thermal treatment assembly, comprising:
a substrate comprising an upper surface configured to facilitate the formation of one or more electronic structures and a lower surface opposite said upper surface, said substrate further comprising a temperature control structure formed within said substrate proximate said lower surface;
a substrate holder configured to support said substrate on a receiving surface, wherein said substrate holder comprises a first electrical contactor within said receiving surface configured to electrically contact a first location of said temperature control structure when said substrate rests on said substrate holder and a second electrical contactor within said receiving surface configured to electrically contact a second location of said temperature control structure when said substrate rests on said substrate holder; and
an electrical power supply configured to couple an electrical potential difference between said first electrical contactor and said second electrical contactor, wherein the application of said electrical potential difference causes the conduction of an electrical current through said temperature control structure between said first location and said second location, which alters a temperature of the temperature control structure, and
the substrate is detachable from the substrate holder.

21. The thermal treatment assembly of claim 20, wherein said temperature control structure comprises a resistive heating structure configured to heat the substrate by Joule ohmic heating.

22. The thermal treatment assembly of claim 21, wherein said resistive heating structure comprises a material sub-layer formed at said lower surface and having an electrical conductivity greater than the electrical conductivity of said substrate.

23. The thermal treatment assembly of claim 22, wherein said material sub-layer comprises a thin film of conductive material deposited on said lower surface.

24. The thermal treatment assembly of claim 22, wherein said material sub-layer comprises a doped region ion implanted into said lower surface.

25. The thermal treatment assembly of claim 22, wherein said substrate comprises a silicon substrate and said resistive heating structure comprises a doped silicon sub-layer formed adjacent said lower surface of said substrate.

26. The thermal treatment assembly of claim 21, wherein said resistive heating structure comprises one or more resistive heating elements, each resistive heating element having a first electrical contact at said first location configured to be coupled to said first electrical contactor and a second electrical contact at said second location configured to be coupled to said second electrical contactor.

27. The thermal treatment assembly of claim 26, wherein each of said one or more resistive heating elements is formed at said lower surface of said substrate and is insulated from said substrate holder by an isolation layer applied to said lower surface of said substrate except at said first location where said first electrical contact couples to said first electrical contactor and at said second location where said second electrical contact couples to said second electrical contactor.

28. The thermal treatment assembly of claim 21, wherein said substrate comprises:
a base layer having said lower surface proximate to which said resistive heating structure is formed;
a device layer having said upper surface that facilitates the formation of said one or more electronic structures; and
an insulation layer disposed between said base layer and said device layer.

29. The thermal treatment assembly of claim 28, wherein said resistive heating structure comprises a material sub-layer comprising a thin film of conductive material deposited on said lower surface.

30. The thermal treatment assembly of claim 28, wherein said resistive heating structure comprises a doped material sub-layer ion implanted into said lower surface of said substrate.

31. The thermal treatment assembly of claim 28, wherein said base layer and said device layer comprise silicon, said insulation layer comprises silicon dioxide, and said resistive heating structure comprises a doped silicon sub-layer.

32. The thermal treatment assembly of claim 28, wherein said resistive heating structure comprises one or more resistive heating elements, each resistive heating element having a first electrical contact at said first location configured to be coupled to said first electrical contactor and a second electrical contact at said second location configured to be coupled to said second electrical contactor.

33. The thermal treatment assembly of claim 32, wherein each of said one or more resistive heating elements is formed at said lower surface of said substrate and is insulated from said substrate holder by an isolation layer applied to said lower surface of said substrate except at said first location where said first electrical contact couples to said first electrical contactor and at said second location where said second electrical contact couples to said second electrical contactor.

34. The thermal treatment assembly of claim 20, wherein said electrical power supply is configured to supply direct current (DC) power.

35. The thermal treatment assembly of claim 20, wherein said electrical power supply is configured to supply alternating current (AC) power.

36. The thermal treatment assembly of claim 20, wherein said substrate holder further comprises a substrate holder temperature control structure configured to complement said temperature control structure formed in said substrate.

37. A substrate, comprising:
a silicon-on-insulator (SOI) substrate having a base layer, a device layer and an insulator layer interposed between the base layer and device layer; and
a resistive heating element embedded within the base layer of said SOI substrate beneath the insulator later, wherein two locations of said embedded resistive heating element are configured to electrically contact two electrical contactors positioned on the upper surface of a substrate holder configured to support said SOI substrate,
said two electrical contactors are configured to receive an electrical potential difference imposed therebetween, and
the substrate is detachable from the substrate holder.

38. A substrate, comprising:
a semiconductor substrate; and
a resistive heating element embedded within the bottom surface layer of said semiconductor substrate, wherein
two locations of said embedded resistive heating element are configured to electrically contact two electrical contactors positioned on the upper surface of a substrate holder configured to support said semiconductor substrate,
said two electrical contactors are configured to receive an electrical potential difference imposed therebetween, and
the substrate is detachable from the substrate holder.

39. A method of operating the thermal treatment assembly of claim 20, comprising:
disposing said substrate on said substrate holder; and
heating said substrate by coupling said electrical potential difference between said first electrical contactor and said second electrical contactor.

40. The method of claim 39, further comprising:
monitoring a temperature of said substrate at one or more locations on said substrate.

41. The method of claim 40, further comprising:
adjusting said temperature at said one or more locations by adjusting said electrical potential difference.

42. The method of claim 40, further comprising:
controlling said temperature at said one or more locations at a target temperature at said one or more locations.

43. The method of claim 40, further comprising:
adjusting said heating of said substrate.

* * * * *